United States Patent [19]

Grossa

[11] 4,361,642

[45] Nov. 30, 1982

[54] PROCESS FOR PRODUCING PHOTOHARDENABLE REPRODUCTION MATERIALS

[75] Inventor: Mario Grossa, Dreieich, Fed. Rep. of Germany

[73] Assignee: E. I. Du Pont de Nemours and Company, Wilmington, Del.

[21] Appl. No.: 268,706

[22] Filed: Jun. 1, 1981

[30] Foreign Application Priority Data

Jun. 3, 1980 [DE] Fed. Rep. of Germany ....... 3020976

[51] Int. Cl.³ .............................................. G03C 5/00
[52] U.S. Cl. .................................. 430/325; 430/309; 430/328; 430/394
[58] Field of Search ............... 430/309, 328, 297, 298, 430/394, 325

[56] References Cited

U.S. PATENT DOCUMENTS

| | | |
|---|---|---|
| 3,415,648 | 12/1968 | Certa .................................. 430/325 |
| 3,597,204 | 8/1971 | Rust .................................... 430/394 |
| 3,723,120 | 3/1973 | Hummel ............................. 430/325 |
| 4,240,737 | 12/1980 | Lawson .............................. 430/309 |

*Primary Examiner*—J. Travis Brown

[57] ABSTRACT

Process for broadening the processing range of photohardenable negatively functioning reproduction materials wherein the unexposed areas are removed by liquid development and while still in contact with the developer the material is diffusely exposed to delayed actinic radiation, the delayed exposure amounting to at least 5% of the time necessary to clear the unexposed material.

5 Claims, No Drawings

PROCESS FOR PRODUCING PHOTOHARDENABLE REPRODUCTION MATERIALS

DESCRIPTION

TECHNICAL FIELD

The invention relates to a process for broadening the processing range of photohardenable negatively functioning reproduction materials which are processed by liquid development.

BACKGROUND ART

Recently photohardenable layers have been used as reproduction materials for many purposes. In the production of images using such materials, differences in the properties of the exposed and unexposed areas of the photohardenable layer are used, e.g., differences in solubility, differences in the point of softening or tackiness, variations in adhesion, etc.

Primarily such materials have gained great practical significance where the solubility of the exposed areas is greatly decreased. After imagewise exposure the unexposed areas of the layer can be removed with a suitable solvent, while the exposed areas, due to their decreased solubility against the solvent, are resistant to development. According to this process, after liquid development, a negative relief image of the original is obtained. The development step generally is carried out so that, first, the unexposed parts of the photohardenable layer swell under the influence of the solution. Subsequently, the swelled areas are removed either by the liquid developer, or by a subsequent washing or spraying process. Either organic solvents, such as e.g., chlorinated hydrocarbons, or aqueous alkali solutions are used as the developing liquid.

It is of particular importance to the quality of a developed material that the solubility differences between the exposed and unexposed areas be as large as possible, i.e., that the material has a broad processing range. For example, if the solubility differences between exposed and unexposed areas are very small, there is the danger that during the development step and exposed areas may have already started to dissolve before the building up of the relief image is finished. This can lead to a poorly formed relief, thin layers, or a decrease in sharpness of the image.

A further disadvantage of reproduction materials with a narrow processing range is that it is necessary to closely control the development time as well as the activity and temperature of the developer. Such close control results in considerable added expense in terms of machinery.

The processing range of a photohardenable material depends on its composition and is substantially determined by the binder used and the photohardenable ingredient of the layer. An additional factor which influences the processing range is the developer system used. Therefore, in actual practice, it is always necessary to make substantial compromises between the optimal composition of the photohardenable layer and, thus, the attainable quality of the image, on the one hand, and a still representative processing speed and processing range, on the other hand.

Therefore, it is an object of this invention to provide a process which makes it possible to broaden in a simple manner the processing range of negatively functioning photohardenable materials which are processed by liquid development without interfering with the composition of the material and the developer system.

DISCLOSURE OF THE INVENTION

In accordance with this invention there is provided a process for broadening the processing range of photohardenable negatively functioning reproduction materials wherein after imagewise exposure the unexposed areas of the material are removed by washing out with a developing solution, characterized in that the material, while in contact with the developing solution, is diffusely exposed to actinic radiation following a delay in exposure which amounts to at least 5% of the time necessary to clear the unexposed photohardenable material.

Suitable light sources for carrying out the process include those which emit a visible high radiation ray, as well as light sources which emit a high radiation ultraviolet light, e.g., carbon arc lamps, Xenon lamps, mercury vapor lamps, etc.

The diffuse exposure is carried out with a delay and its duration should not be more than 95 percent of the clearing time for the photohardenable material. Clearing time means the minimal standing time of the unexposed photohardenable material in the developer solution whereby the material can be removed from its support.

The optimal exposure time generally is about 60 to 90 percent of the clearing time and can be easily determined by simple test procedure such as is described in Example 1. Diffuse exposure takes place while the material is in contact with the developer solution. The process can be used with manual as well as mechanical processing. With mechanical processing, it is only necessary to place a corresponding exposure apparatus in the processing section of the machine. To obtain the effect of the invention, it is unimportant whether the material is placed completely in the developer solution or only the surface is moistened with the developer solution, for example, by means of a spray device during the diffuse exposure.

Since the photohardenable material during the diffuse exposure is in contact with the developer solution, substantially all types of processing machines known in the art can be used which operate according to the principle of spraying liquid jets, dipping while moving, and brushing and rubbing. With the use of the described process, the processing range of the photohardenable negatively functioning liquid developable materials can be considerably broadened, e.g., in the range of about two-fold up to four-fold. The process is of special significance for those liquid developable materials which are developed with aqueous and/or aqueous alkali solutions. These materials generally have a narrower processing range as a result of their composition than materials which require solvent development. Typical light hardenable materials with which the described process can advantageously be used are primarily aqueous-alkali processable photoresist materials for use as etching or plating resists as they are described, for example, in German Pat. No. 2 611 577, and in Germany Preliminary Published Application Nos. 2 205 146, 2 320 849, and 2 816 774. The process, naturally, is equally suited to broaden the processing range of photoresist materials, which are processed in the presence of one or several solvents. A further group of photohardenable materials, where the described process can be used with advantage, are liquid developable materials for use in the graphic arts industry for the production of lined and screen copies or masks, as for example, they are described in German Published Application Nos. 2 202 360 and 2 651 864. Moreover, the process is also suited to broaden the processing range of relief and planographic printing plates, insofar as these are produced using the liquid development process.

Preferred results are obtained in case of printing plates with the plates having a relief thickness. Examples of suitable printing plates are described in German Pat. Nos. 1 031 130, 1 093 209 and 2 215 090 and in German Published Application No. 1 572 153.

The choice of developer depends on the composition of the photohardenable composition. Many such compositions are developed using organic solvents and/or solvent mixtures, as for example, carbon tetrachloride, trichloroethane, trichloroethylene, methyl chloroform, tetrachloroethylene, methyl ethyl ketone, etc. Additional suitable solvents are described in U.S. Pat. No. 3,475,171 incorporated by reference. The preferred photohardenable materials are developable with aqueous solutions, e.g., water soluble bases in concentrations, which generally are in the range of 0.01 to 10 weight percent. Suitable bases include: alkali hydroxides, such as lithium-, sodium- and potassium hydroxide. In addition, alkali salts of weak acids, e.g., sodium and potassium carbonate and bicarbonate, as well as ammonium hydroxide, alkali phosphates, etc., are suitable.

The process of this invention makes it possible in a simple way to broaden the processing range of photohardenable materials without interfering with the composition of the material or the developer system, and thereby to obtain the great advantage of increased freedom with respect to the composition of the photohardenable layer. It is also advantageous, that as a result of the broad processing range, it is not necessary to have expensive controls of the time of developing, as well as temperature and activity of the developer, so that processing can also take place in apparatus of simple design. Additionally, the postexposure to be carried out in connection with liquid development and the drying can be either eliminated, or the postexposure time can be considerably decreased.

The fact that the photohardenable material can be exposed before the unexposed image portions are removed is surprising to those skilled in the art because, as is known, considerable effort has been made to seal off the development section of processing apparatus against the penetration of actinic radiation. It is even more surprising that by such an exposure the processing range of material can be broadened. It is expected that diffuse exposure would bring about a slight photohardening in the unexposed parts of the layer thereby reducing the differentiation between the exposed and unexposed areas decreasing the processing range, and making the washing out process more difficult.

EXAMPLES

The following Examples illustrate the invention:

EXAMPLE 1

A light sensitive mixture of the following composition is coated onto a polyethylene terephthalate support film and is provided with a protective layer of polyvinyl alcohol:

35 g partially esterified styrene/maleic acid anhydride copolymer (50/50 mol-%), number average molecular weight 20,000, 20 g acrylic acid/acrylic acid ethyl ester/methacrylic acid methyl ester copolymer (7/56/37 mol-%) number average molecular weight 200,000, 16 g carbon black pigment, 15 g triethylene glycol diacrylate, 10 g 2,2'-bis(2-chlorophenyl)-4,4',5,5'-tetraphenylbisimidazole, 4 g Michler's ketone.

The material after drying has an optical density of 3.0 and the thickness of the light sensitive layer is 10 $\mu$m.

Three test strips A, B and C are made from this material. Sample A remains unexposed. Samples B and C are exposed for 13 seconds to a mercury vapor lamp (1,000 W) at a distance of 70 cm through a halftone wedge, (step wedge constant 0.1).

To determine the clearing time, sample A is developed with a solution of the following composition at 20° C. until the light sensitive layer can be removed from the film support by subsequent spraying with water:

4.0 g potassium carbonate
1.0 g potassium hydrogen carbonate
95.0 g water.

This is the case after a time of action of the developer of 6 seconds, i.e., the clearing time is 6 seconds.

Samples B and C are developed using a developer of the above described composition at 20° C. at varied times in a conventional processing machine, which in the development section has a high UV radiation light source in the form of two closely arranged 40 W lamps at a distance of 15 cm from the film surface. After development, the unexposed areas are removed by spraying with water at 30° C.

The only difference in the processing of samples B and C is that sample B is developed without postexposure, while sample C is diffusely postexposed for 11 seconds after being placed in the developer solution.

The obtained results are summarized in the Table 1:

TABLE 1

| TIME OF DEVELOPMENT (20° C.) (seconds) | NUMBER OF WEDGE STEPS WITH Dmax | |
|---|---|---|
| | Sample B without UV | Sample C with UV |
| 11 | 16 | 16 |
| 22 | 10 | 16 |
| 33 | 7 | 12 |
| 44 | 1 | 7 |

From the table it is seen that the processing range can be doubled by a diffused exposure during development. Thus, the number of wedge steps of Dmax remains at 16 for sample C, but drops to 10 for sample B when the development time doubles.

EXAMPLE 2

A photohardenable material is prepared as described in Example 1.

Three test strips, A, B and C are made of this material. Sample A remains unexposed. Samples B and C are exposed for 15 seconds using a mercury vapor lamp (1,000 W) at a distance of 70 cm through a screen cover sheet (38% dots). To determine the clearing time, sample A is developed at 20° C. in the processing solution given in Example 1 until the light sensitive layer can be removed from the support by subsequent spraying of water. The clearing time of the material is 6 seconds.

Samples B and C are developed in a tray in a developer of the above described composition at varied times at 20° C. After development the unexposed areas are removed by spraying with water of 30° C. The only difference in the processing of samples B and C is that sample B is developed without postexposure, while C is diffusely postexposed for 1 second, at a distance of 15 cm from the film surface with the radiation light source described in Example 1 after being placed in the developer solution. Subsequently, the integral density is measured with a densitometer.

The obtained results are summarized in the Table 2:

TABLE 2

| TIME OF DEVELOPMENT (20° C.) (seconds) | INTEGRAL DENSITY | |
|---|---|---|
| | Sample B without UV | Sample C with UV |
| 15 | 0.43 | 0.43 |
| 20 | 0.34 | 0.43 |
| 25 | 0.29 | 0.42 |
| 30 | 0.17 | 0.41 |

From Table 2 it is seen that the processing range can be approximately doubled by a diffuse exposure during development. Thus, the integral density at 30 seconds' development is substantially unchanged from that for 15 seconds for sample C while changing by a factor of about 0.4 for sample B.

EXAMPLE 3

A light sensitive mixture of the following composition is coated onto a polyester support film, is dried (layer thickness 25 μm) and is provided with a transparent removable polyethylene terephthalate cover film:

30 g acrylic acid ethyl ester/acrylic acid copolymer (89/11 mol-%),
40 g partially esterified styrene/malaic acid anhydride copolymer (50/50 mol-%) (described in Example 1),
27 g triethylene glycol dimethylmethacrylate,
2 g benzophenone,
0.5 g Michler's ketone,
0.5 g bis (4-diethylaminophenyl)-(4-N-ethylamino-1-naphthyl)-methane hydrochloride.

After removing the cover film the material is laminated with the layer side onto three copper circuit plates A, B and C as they are used for the preparation of printed circuits. To determine clearing time, plate A is sprayed with a solution of the following composition at 22° C. until the light sensitive layer is dissolved:

2.0 g potassium carbonate
98.0 g water.

The clearing time is 30 seconds. Plates B and C are exposed for 60 seconds to a mercury vapor lamp (1,000 W) at a distance of 70 cm through a halftone wedge (step wedge constant 0.1).

Subsequently the plates are developed using a developer of the above described composition at 22° C. in a processing machine used for this purpose, which in the development section contains a light source described in Example 1. After development the plates are washed out by spraying with water of 25° C. The only difference in the processing of plates B and C is that plate B is developed without postexposure, while plate C is diffusely postexposed for 10 seconds after being placed in the developer solution. The obtained results are summarized in Table 3:

TABLE 3

| TIME OF DEVELOPMENT (20° C.) (seconds) | NUMBER OF COMPLETE OBTAINED WEDGE STEPS WITH Dmax | |
|---|---|---|
| | Plate B without UV | Plate C with UV |
| 30 | 11 | 11 |
| 60 | 7 | 11 |
| 120 | 6 | 11 |
| 240 | 1 | 10 |

From the table it is seen that the processing range, i.e., the time between the completed image build up and start of dissolving of the polymeric image portions can be quadrupled, i.e., increased from 30 to 120 seconds, by diffuse exposure according to this invention.

EXAMPLE 4

A light sensitive mixture of the following composition is coated onto a polyester support film, dried (layer thickness 25 μm), and provided with a transparent removable polyethylene terephthalate cover film:

55 g polyacrylic acid methylester,
22 g trimethylol propane trimethylmethacrylate,
21 g trimethylol propane trimethylacrylate,
1 g benzophenone,
0.5 g Michler's ketone,
0.5 g bis (4-diethylaminophenyl)-(4-N-ethylamino, 1-naphthyl)-methane hydrochloride.

After removing the cover film the material is laminated with the film side onto three copper circuit plates A, B and C, as they are used for the production of printed circuits.

To determine clearing time, plate A is developed in a solution of methyl chloroform at 20° C. until the light sensitive layer is dissolved. The clearing time is 40 seconds. Plates B and C are exposed to a mercury vapor lamp (1,000 W) at a distance of 70 cm through a lined cover sheet with 0.7 mm wide lines. The unexposed areas are removed by brushing in methylchloroform.

The only difference in the processing of plates B and C is that Plate B is developed without postexposure, while plate C is diffusely postexposed for 15 seconds after being placed in the processing solution. The obtained results are summarized in Table 4:

TABLE 4

| TIME OF DEVELOPMENT (20° C.) (seconds) | WIDTH OF OBTAINED STAGES | |
|---|---|---|
| | Sample B without UV | Sample C with UV |
| 50 | 0.7 mm | 0.7 mm |
| 80 | washed off | 0.7 mm |
| 120 | washed off | 0.6 mm |
| 160 | washed off | 0.5 mm |

From the table it is seen that the processing range can be approximately doubled, i.e., increased from 50 to about 120 seconds, by diffuse exposure during development.

EXAMPLE 5

A light sensitive mixture of the following composition is coated onto 3 aluminum plates A, B and C, as they are used for offset printing plates, and is provided with a thin vinyl alcohol layer as a protective film:

62 g methacrylic acid methylester/methacrylic acid copolymer (90/10), 25 g trimethylolpropane triacrylate, 7 g of a mixture of triethylene glycol-di-n-hexanoic acid triethylene glycol-di-n-octanoic acid, 3.5 g 2,2'-bis-(2-chlorophenyl)-4,4',5,5'-tetraphenyl-bisimidazole, 1.5 g Michler's ketone, 1.0 g bis (4-diethylaminophenyl)-(4-N-ethylamino-1-naphthyl)-methane hydrochloride.

To determine clearing time plate A is treated at 25° C. in a developer of the following composition:

1.0 g sodium carbonate 5.0 g ethylene glycol 94.0 g water

The light sensitive layer can be removed from the support film after 1.5 minutes of developing time by spraying with water.

Plates B and C are exposed at a distance of 10 cm through a lined cover sheet (line width 0.2 mm). Two 40 W lamps near each other serve as the light source. Subsequently the two plates are developed in a tray in the above indicated developer at 25° C. After development, the unexposed areas are removed by spraying with water of 30° C.

The only difference in the processing of plates B and C is that plate B is developed without postexposure, while plate C is diffusely postexposed for 40 seconds to a radiation light source described in Example 1 at a distance of 15 cm after it is in the developer solution.

The obtained results are summarized in the Table 5:

TABLE 5

| TIME OF DEVELOPMENT (20° C.) (seconds) | WIDTH OF OBTAINED STAGES | |
|---|---|---|
| | Plate B without UV | Plate C with UV |
| 90 | 0.2 | 0.2 |
| 180 | 0.1 | 0.2 |
| 300 | washed off | 0.15 |

From the table it is seen that the processing range can be doubled, i.e., increased from 90 to 180 seconds, by diffuse postexposure during development.

I claim:

1. Process for broadening the processing range of photohardenable negatively functioning reproduction materials wherein after imagewise exposure the unexposed areas of the material are removed by washing out with a developing solution, characterized in that the material, while in contact with the developing solution, is diffusely exposed to actinic radiation following a delay in exposure which amounts to at least 5% of the time necessary to clear the unexposed photohardenable material.

2. A process according to claim 1, characterized in that the delay in exposure amounts to 10 to 40% of the time to clear the unexposed material.

3. A process according to claim 1 or claim 2, characterized in that during the diffuse exposure the material is below the level of the developing solution.

4. A process according to claim 3, characterized in that the developing solution is an aqueous alkali solution.

5. A process according to claim 1 or claim 2, characterized in that the photohardenable material comprises a support bearing a layer of a photohardenable composition comprising a polymeric binder, an addition polymerizable ethylenically unsaturated compound and a photoinitiator.

* * * * *